United States Patent
Wakamatsu

[19]

[11] Patent Number: 6,054,867
[45] Date of Patent: *Apr. 25, 2000

[54] METHOD FOR STABILIZING FEEDBACK LOOP OF IMPEDANCE MEASURING APPARATUS

[75] Inventor: Hideki Wakamatsu, Hyogo, Japan

[73] Assignee: Hewlett-Packard Company, Palo Alto, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/892,960

[22] Filed: Jul. 16, 1997

[30] Foreign Application Priority Data

Jul. 26, 1996 [JP] Japan ..................... 8-197200

[51] Int. Cl.$^7$ ................................. G01R 27/28
[52] U.S. Cl. .................. 324/650; 324/709; 324/76.79
[58] Field of Search ............... 330/2, 107; 455/119; 323/282; 324/650, 683, 709, 76.52, 76.77, 76.79; 702/57, 79

[56] References Cited

U.S. PATENT DOCUMENTS 4,276,514  6/1981  Huang ..................... 330/149
4,933,986  6/1990  Leitch ..................... 455/119
5,623,226  4/1997  Whitmarsh ................ 330/2

FOREIGN PATENT DOCUMENTS 3-61863   3/1991  Japan .

OTHER PUBLICATIONS

Roberge, Operational Amplifiers: Theory and Practice, John Wiley & Sons, p. 171–185, 233, 537, 1975.

*Primary Examiner*—Diep N. Do
*Assistant Examiner*—Russell M. Kobert

[57] ABSTRACT

A method for stabilizing feedback loop in impedance measuring equipment involves determining a null loop transfer function of the impedance measuring device by utilizing multiple independent, known impedances. The phase characteristics of the null loop is measured for each multiple independent, known impedances. Based on the measured phase characteristics, the loop characteristic is determined with regard to impedances of arbitrary devices under test (DUTs). The best phase compensation amount is then computed for use over the entire range of DUTs.

3 Claims, 12 Drawing Sheets

METHOD FOR STABILIZING FEEDBACK LOOP OF IMPEDANCE MEASURING APPARATUS

FIELD OF THE INVENTION

The present invention relates to impedance measuring equipment that performs measurements of component parameters, circuit parameters, or material characteristics such as impedances at high frequencies across a wide impedance range and, more particularly, performs accurate measurements using measurement cables of arbitrary length.

BACKGROUND OF THE INVENTION

It is known that at low frequencies the four-terminal pairs impedance measuring method is the measuring method which is not affected by the measurement cables that connect the device under test (hereinafter DUT) with the main body of the measurement equipment. For example, accurate measurements are possible even with long measurement cables in designs such as those that provide a multiplexer between the DUT and the main body of the measurement equipment, so that they can switch between the DUT and the main body of the measurement equipment.

However, as the measurement frequency increases, the phase shift within the measurement cables lowers the accuracy of the measurement, and the feedback loop that is a part of the measurement equipment becomes less stable. In order to stabilize the feedback loop, strict constraints are placed on the feedback loop and on the measurement cables. Therefore, there is no freedom in the selection of the measurement cables.

Figure 2:
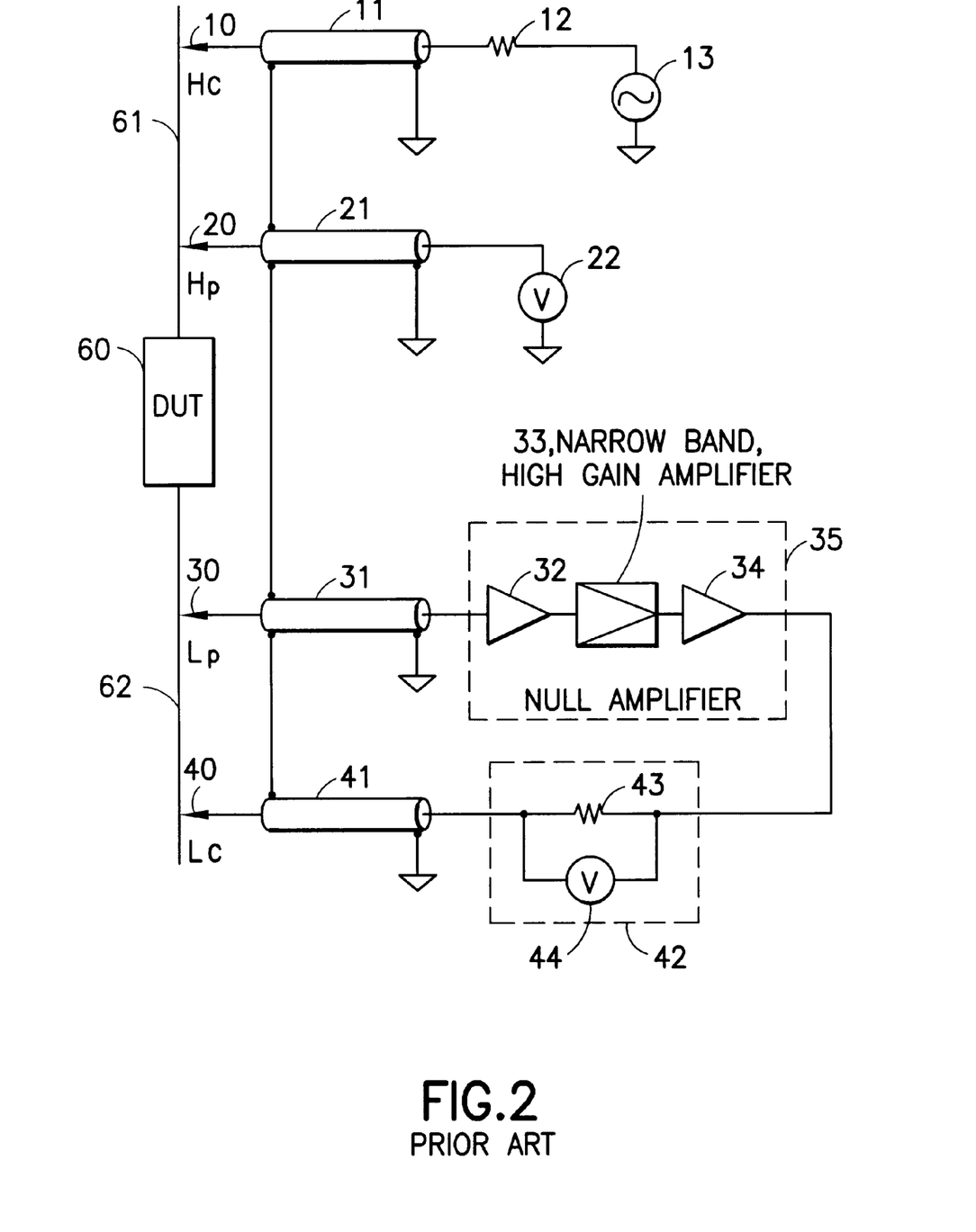
FIG. 2 shows an example of impedance measuring equipment of the prior art with four-terminal pairs.

An explanation will be provided herein of the problems associated with a typical impedance measuring device using four-terminal pairs, as illustrated in FIG. 2. Specifically, the discussion will involve the problems associated with the feedback loop and with increasing the frequency or using measurement cables of arbitrary length. Note that while not shown in FIG. 2 and in subsequent figures, the impedance measuring equipment further includes a portion that calculates measured values, and a portion that controls the functions of the measurement equipment.

In the operation of the impedance measuring equipment as shown FIG. 2, the measurement current from a measurement signal generator 13 is supplied through a resistor 12, a measurement cable 11, and a High Current (Hc) measurement terminal 10, to a DUT 60. The measurement current flows through another terminal 62 of DUT 60, a Low Current (Lc) measurement terminal 40, a measurement cable 41, a range resistor 43 used as a current detector, and is pulled into a null amplifier stage 35. The current value is then determined by measuring the voltage across resistor 43. In other words, resistor 43 and voltmeter 44 form a current measuring stage 42.

At the same time, the electric potential of terminal 62 of DUT 60 goes from a Low Potential (Lp) measurement terminal 30, through a measurement cable 31, and is applied to null amplifier stage 35. The output of null amplifier stage 35 pulls in the current from an ammeter 42, so that the electric potential of terminal 62 of DUT 60 is the same as the ground potential of null amplifier stage 35. That is to say, the feedback loop comprising measurement cable 31, null amplifier stage 35, current measuring stage 42, measurement cable 41, and terminal 62 of DUT 60 performs negative feedback control and, thus, maintains the electric potential of terminal 62 of DUT 60 at a zero potential. This type of feedback loop is referred to as a null loop.

The electric potential of terminal 61 of DUT 60 passes through a High Potential (Hp) measurement terminal 20 and a measurement cable 21 and is measured by a voltmeter 22. As explained above, the electric potential of terminal 62 is maintained at the ground potential, so that voltmeter 22 can measure the voltage across DUT 60 (i.e., across Lp and Hp terminals). The desired measured value of the impedance is then computed as the ratio of the measured value of voltmeter 22 and the measured value of current measuring stage 42.

However, if the phase margin of the open loop transfer function of the null loop is not sufficient, the null loop becomes unstable and oscillates which makes it impossible to utilize the measurement circuit using four-terminal pairs. One approach to remedying the stability problem is to employ phase compensation within the null loop.

In the past, the following method has been utilized for phase compensation of the null loop. As shown in FIG. 2, a null amplifier stage 35 is utilized to provide the necessary phase compensation and includes an input amplifier 32, a narrow band high gain amplifier 33, and an output amplifier 34 in series.

Figure 3:
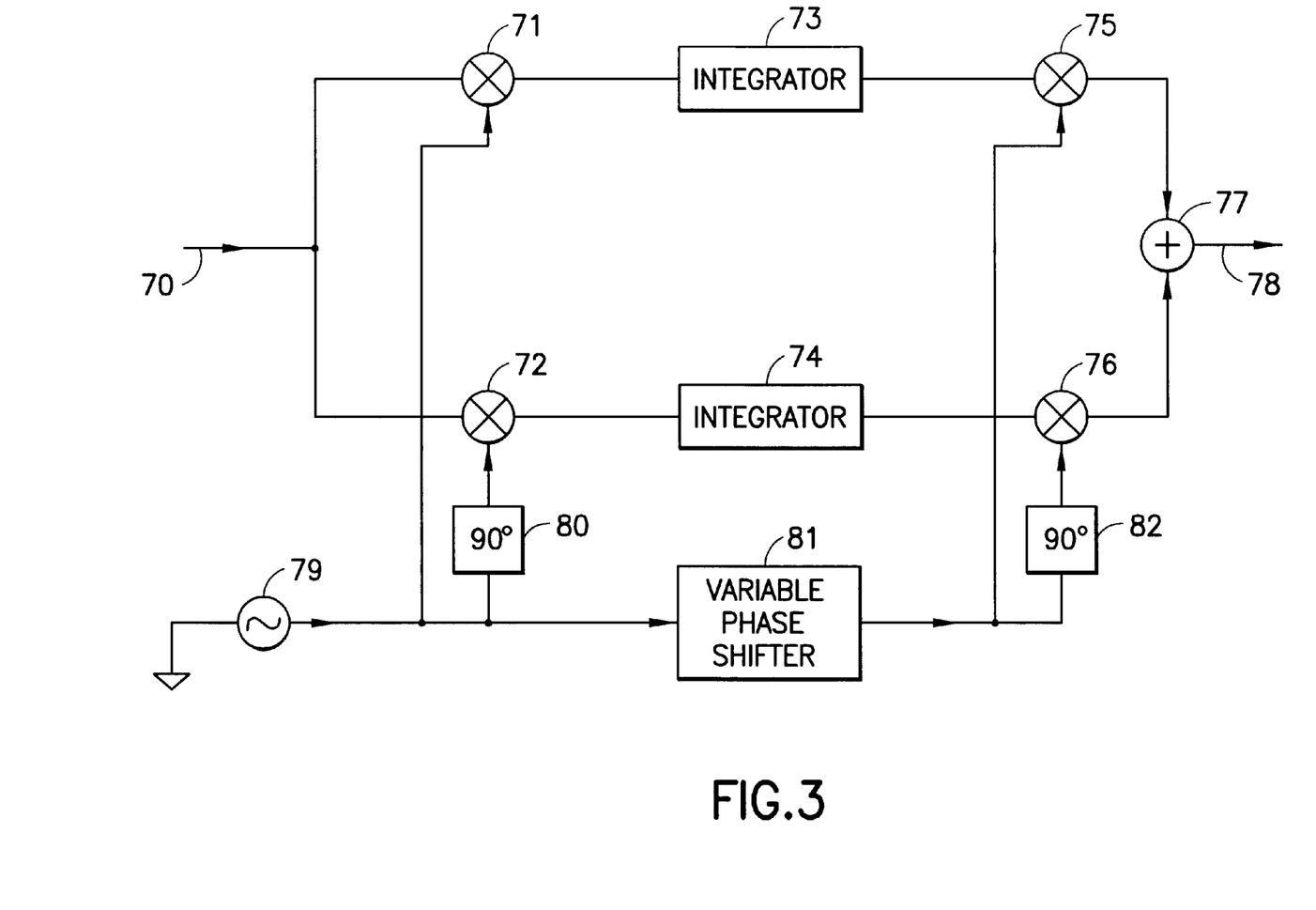
FIG. 3 shows an example of a narrow band amplifier.

FIG. 3 illustrates the design of narrow band high gain amplifier 33, which operates as follows. A synchronizing signal from a synchronizing signal generator 79, having the same frequency as the measurement signal generator, is directly applied as a reference phase signal to a phase detector 71. The synchronizing signal is also applied as a reference phase signal to a phase detector 72, after being phase shifted 90 degrees by a phase shifter 80. Phase detectors 71 and 72 are thus orthogonal synchronized phase detectors.

The alternating current signal that is applied to the input terminal 70 is split into two orthogonal components by phase detectors 71 and 72 and detected synchronously, resulting in direct current signals.

The synchronizing signal from synchronizing signal generator 79 goes through a variable phase shifter 81 and is applied as a carrier wave to a modulator 75, and also to a modulator 76 after being phase shifted 90 degrees at a phase shifter 82. Therefore, modulators 75 and 76 are orthogonal modulators.

The direct current signals are integrated at integrators 73 and 74, respectively, and then inputted to modulators 75 and 76 which transform the direct current signals into alternating currents with a phase shift difference of 90 degrees. The alternating currents are then combined at an adder 77 to regenerate an alternating current signal which is outputted via output 78.

Figure 4:
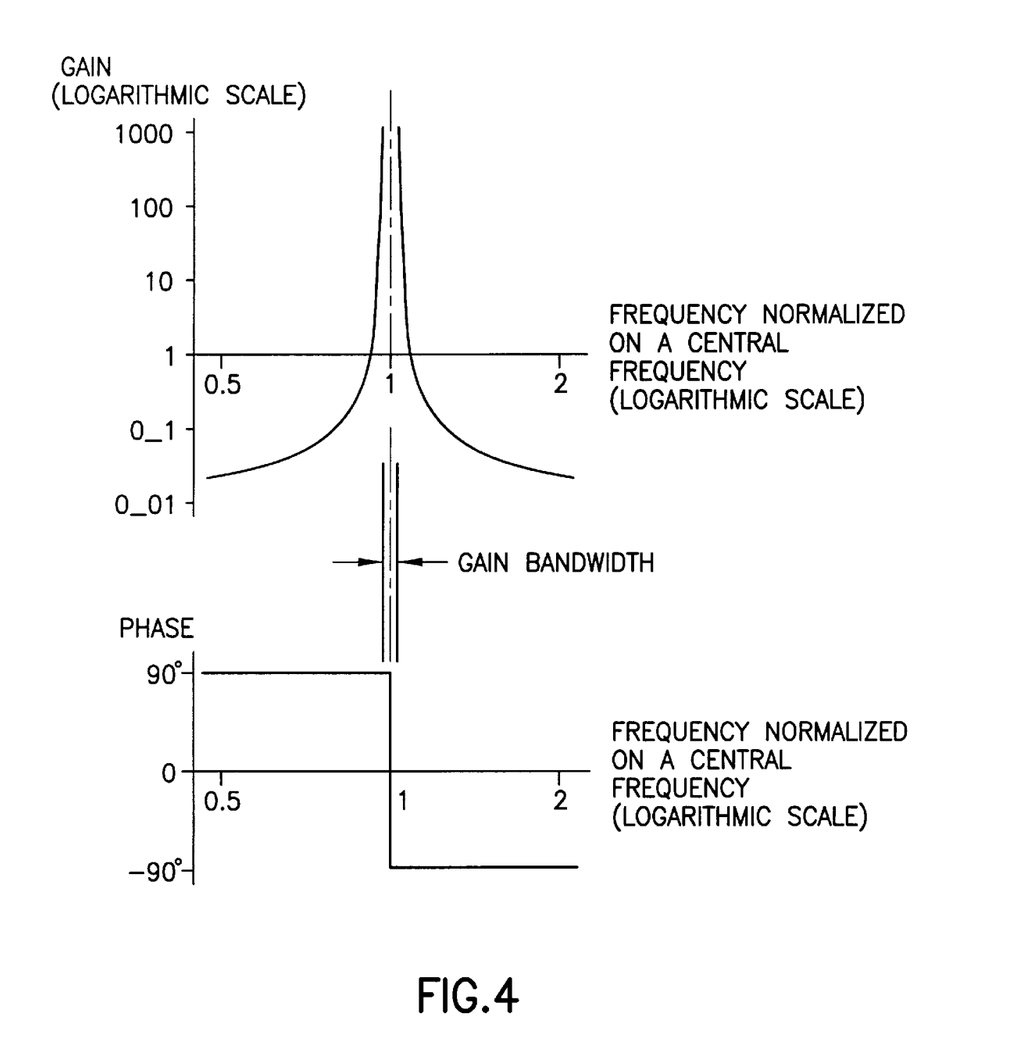
FIG. 4 shows an example of the phase characteristics of a narrow band amplifier.

In this way, narrow band high gain amplifier 33 performs orthogonal synchronous phase detection of an alternating current signal to transform it into a direct current signal, integrates the direct current signal, and performs orthogonal modulation to return it to an alternating current signal, thus achieving a high gain in a narrow band. FIG. 4 illustrates an example of the gain characteristic and the phase characteristics when the phase shift amount of the phase shifter are zero.

Figure 5:
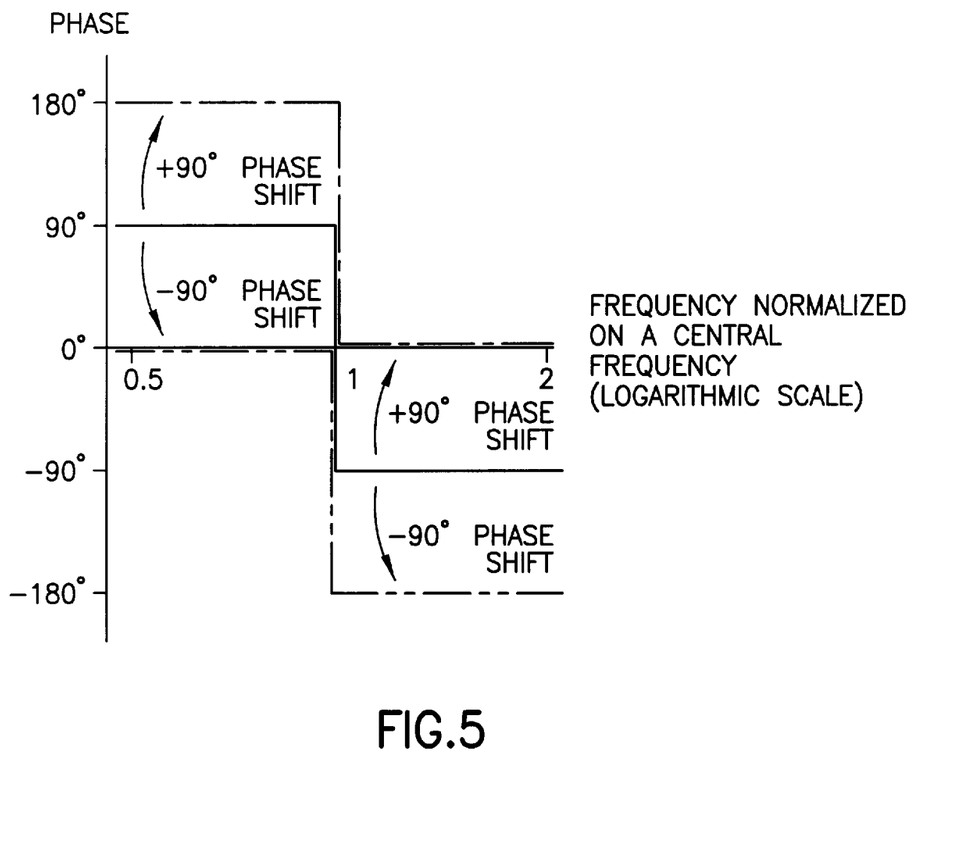
FIG. 5 shows an example of the phase shift characteristics of a narrow band amplifier.

Note that it is possible to create a narrow band high gain amplifier with an arbitrary phase difference by using variable phase shifter 81 to shift the phase between the orthogonal phase detectors and the orthogonal modulators. FIG. 5 shows an example of the phase characteristics as the phase difference between the orthogonal phase detectors and the orthogonal modulators is varied at 0 degrees, +90 degrees, and −90 degrees.

An important condition for maintaining stability in the null loop is that a phase of 0 degrees does not exist within the gain bandwidth of the null loop containing narrow band high gain amplifier 33. Therefore, if the conditions are strictly determined at the outset, such as the electrical length of the measurement cables, it is possible to adjust the phase shift amount of narrow band high gain amplifier 33 and to build stability into the null loop prior to manufacture and shipping. In the alternative, if the impedance measuring equipment has the ability to determine the necessary phase shift amount (phase compensation amount) during use, it is possible to provide a very flexible solution with regard to the cable length.

An example of the latter approach is provided in Japanese Laid-Open Publication Number 03-61863 by the present applicant(s) entitled "Adaptive Type Half-Bridges And Impedance Meters." The device determines and specifies a phase shift amount in order to stabilize the feedback loop, based on the phase characteristics of the measured feedback loop. In particular, the device separates the measurement signal generator from the measurement circuit, cuts off the null loop, utilizes an additional circuit to measure the phase shift amount of the null loop exclusive of narrow band high gain amplifier 33, and then sets a variable phase shifter 81 so that the total phase shift amount of the null loop is 180 degrees.

Figure 6:
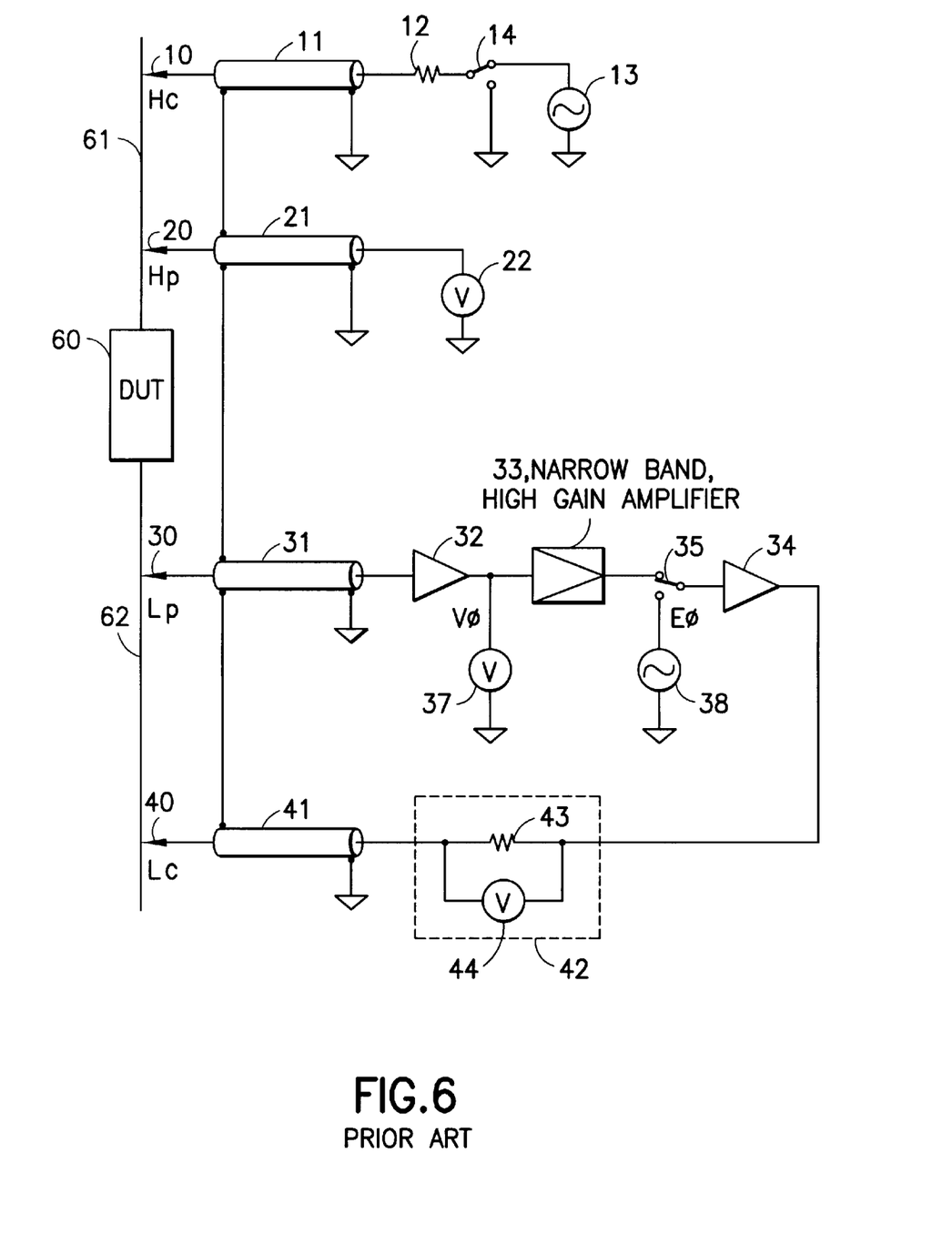
FIG. 6 shows an example of the application of the prior art.

Referring to FIG. 6, which illustrates a corresponding conceptual diagram of the above-mentioned device, the operation of the above-mentioned device will be described. Initially, switch 14 is flipped to the ground side, which disconnects signal generator 13 from the measurement circuit. Switch 36 is then flipped to the side of an input signal generator 38. As a result, the null loop is cut off and the input signal Eφ of input signal generator 38 is applied to output amplifier 34. The voltage Vφ that appears on the output side of an input amplifier 32 is measured by a vector voltmeter 37. The phase difference between Vφ and the input signal Eφ is the phase shift amount of the null loop exclusive of narrow band high gain amplifier 33. Based on the determined phase shift amount, variable phase shifter 81 (FIG. 3) is adjusted so that the total phase shift amount of the null loop is 180 degrees.

Figure 7:
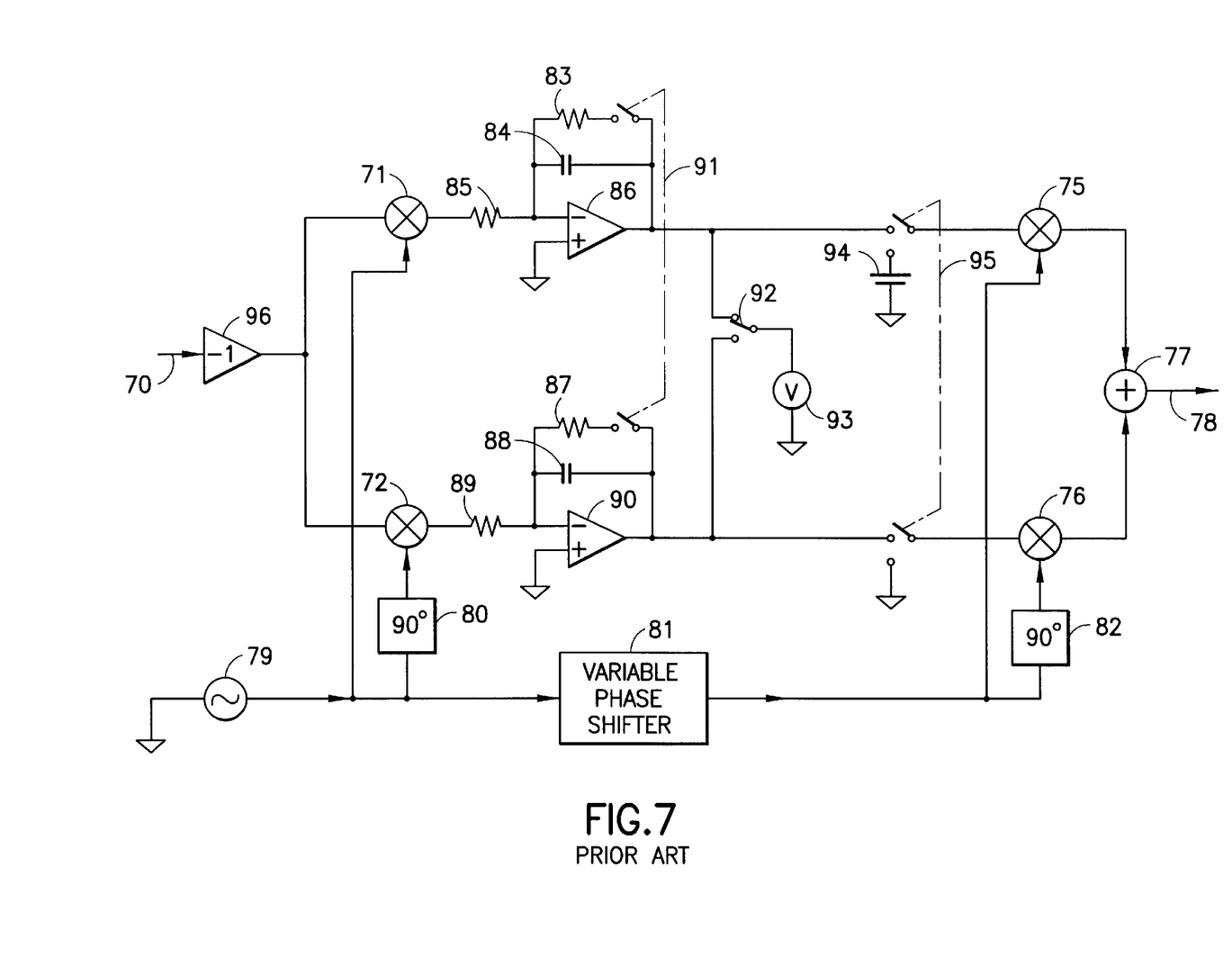
FIG. 7 shows an example of the application of the prior art.

The actual phase measurement can be performed by using a phase measurement circuit incorporated into a narrow band high gain amplifier 33, as shown in FIG. 7.

Referring to FIG. 7, an operational amplifier 86, resistor 85 and capacitor 84 constitute an integrator. A resistor 83 and a switch 91 are coupled in series between an input and output of operational amplifier 86, such that when switch 91 is closed, the integrator switches over to the amplifier. The same also applies for an operational amplifier 90, resistor 89, capacitor 88, resistor 87, and switch 91.

When the phase is measured, the phase shift amount of variable phase shifter 81 is set to zero or some known value. Switch 95 is used to ground the input of modulator 76 or to connect the input of modulator 75 to a direct current power supply 94. The direct current voltage of direct current power supply 94 is converted to an alternating current signal that goes around the null loop, passes through an input 70 and a buffer 96, and is applied to phase detectors 71 and 72. If switch 91 is set in the closed position to switch from the integrator to the voltage amplifier, and switch 92 causes the direct current voltage that is split into orthogonal components by phase detectors 71 and 72 to be measured by voltmeter 93, the phase can then be determined as an argument in the complex plane.

In the entire process of the impedance measurement, the stage that performs the phase measurement in Japanese Laid-Open Publication Number 03-61863 can take either of the following two forms.

(1) When the DUT is connected and the measurement of the impedance is initiated, the first half of each measurement cycle is allocated to determining the phase compensation amount of the null loop.

(2) The phase compensation amount of the null loop is determined at system construction time (such as when the cables are extended) with the DUT in the open condition, and the result is stored in the equipment's memory. The stored value of the compensation amount can be retrieved and utilized to measure an impedance.

It is important to understand that the total phase shift of the null loop is not the arithmetic sum of the respective effects of the cable lengths and the impedance value of the DUT. In other words, except under special conditions, the phase shift cannot be apportioned to a phase shift function based on the impedance value of the DUT plus the function for the cable lengths.

The above-mentioned forms (1) and (2) have complementary advantages and disadvantages. Form (1) makes it possible to obtain extremely flexible stability with respect to the value of the DUTs and the cable lengths. However, additional time is required to measure the phase, which reduces the overall measurement speed.

Form (2) has no measurement speed overhead. However, it does not guarantee the stability of the null loop with respect to arbitrary values of the DUTs because the null loop transfer function changes according to the value of the DUTs. Therefore, it is necessary to utilize the phase difference obtained from some DUTs in order to determine an optimal phase compensation amount that will guarantee the phase margin across the entire range of DUTs. The only way to achieve flexibility, however, is to predict the phase shift based on the internal design of the impedance measurement equipment and to have a specially measured cable length.

In general, impedance measuring equipment that utilizes a four-terminal pair method includes a feedback loop which receives a current from a DUT in order to measure the current, while keeping the electric potential of the measured terminals at the ground potential. When making remote measurements at high frequencies, the feedback loop may become unstable and measurement may not be possible. One method to remedying the stability problem is disclosed in Japanese Laid-Open publication Number 03-61863 (as described above). However, the method either results in restrictions on the measurement cables or increases the measurement time.

Accordingly, it is an object of the present invention to provide a method for accurately determining the stabilizing compensation amount with the greatest margin across the entire range of values of the DUT, without sacrificing measurement time.

SUMMARY OF THE INVENTION

A method for stabilizing feedback loop in impedance measuring equipment involves determining a null loop transfer function of the impedance measuring device by utilizing multiple independent, known impedance. The phase characteristics of the null loop is measured for each multiple independent, known impedances. Based on the measured phase characteristics, the loop characteristic is determined with regard to impedances of arbitrary DUTs. The best phase compensation amount is then computed for use over the entire range of DUTs.

The present invention provides a method to routinely determine a stable phase compensation amount, without requiring any assumptions, across the full range of impedances for the DUTs, and without causing any overhead with regard to measurement speed.

The present invention also makes it possible to create high speed impedance measuring equipment that responds flexibly to requirements such as cable length, use of multiple materials, use of multiplexers, and measurements at high frequencies whose wavelengths exceed the cable length. This can be accomplished without requiring any restrictions on the conditions of use.

DESCRIPTION OF THE REFERENCE NUMERALS

10: Hc Measurement Terminal
11: Measurement Cable
12: Resistor
13: Signal Generator
14: Switch
20: Hp Measurement Terminal
21: Measurement Cable
22: Voltmeter
30: Lp Measurement Terminal
31: Measurement Cable
32: Input Amplifier
33: Narrow Band High Gain Amplifier
34: Output Amplifier
35: Null Amplifier
36: Switch
37: Vector Voltmeter
38: Input signal generator
40: Lc Measurement Terminal
41: Measurement Cable
42: Ammeter
43: Range Resistor
44: Voltmeter
60: Device Under Test (DUT)
61: Terminal Of The DUT
62: Terminal Of The DUT
70: Narrow Band High Gain Amplifier Input
71: Synchronized Phase Detector
72: Synchronized Phase Detector
73: Integrator
74: Integrator
75: Modulator
76: Modulator
77: Adder
78: Narrow Band High Gain Amplifier Output
79: Synchronizing Signal Generator
80: 90 Degree Phase Shifter
81: Variable Phase Shifter
82: 90 Degree Phase Shifter
83: Resistor
84: Capacitor
85: Resistor
86: Operational Amplifier
87: Resistor
88: Capacitor
89: Resistor
90: Operational Amplifier
91: Switch
92: Switch
93: Voltmeter
94: Direct Current Source
95: Switch
96: Buffer Amplifier

DETAILED DESCRIPTION OF THE INVENTION

Before proceeding with the description of the present invention, an overview will be provided to explain the order of presentation. Initially, the null loop transfer function will be described as a function of the impedance Zx of the DUT (as shown below in equation (4)). Next, the relationship between the transfer function and the value of the DUT will be described to provide some background into the phase compensation method of the present invention. A method to determine the constants in equation (4) by measuring three known impedances is then explained. Finally, the steps required to measure the three known impedances will be described.

Turning to the first point, the null loop transfer function will be described as a function of the impedance Zx of the DUT. The circuit design that is utilized to measure the loop transmission characteristics and the method for measuring the loop transmission characteristics are the same as those described in the above-mentioned patent application Heisei 1-184223. A brief explanation will be provided herein regarding the above circuit design and its operation, as shown in FIG. 6.

A signal generator 13 is initially disconnected from the measurement circuit by a switch 14, and the null loop is cut off by a switch 36. A signal Eφ with the same frequency as that of the measurement signal generator 13 is introduced into the null loop from an input signal generator 38, and a corresponding voltage Vφ on the output side of an input amplifier 32 is measured by a vector voltmeter 37. Based on this information, the loop transmission characteristics of the null loop is known, except for narrow band high gain amplifier 33.

Figure 8:
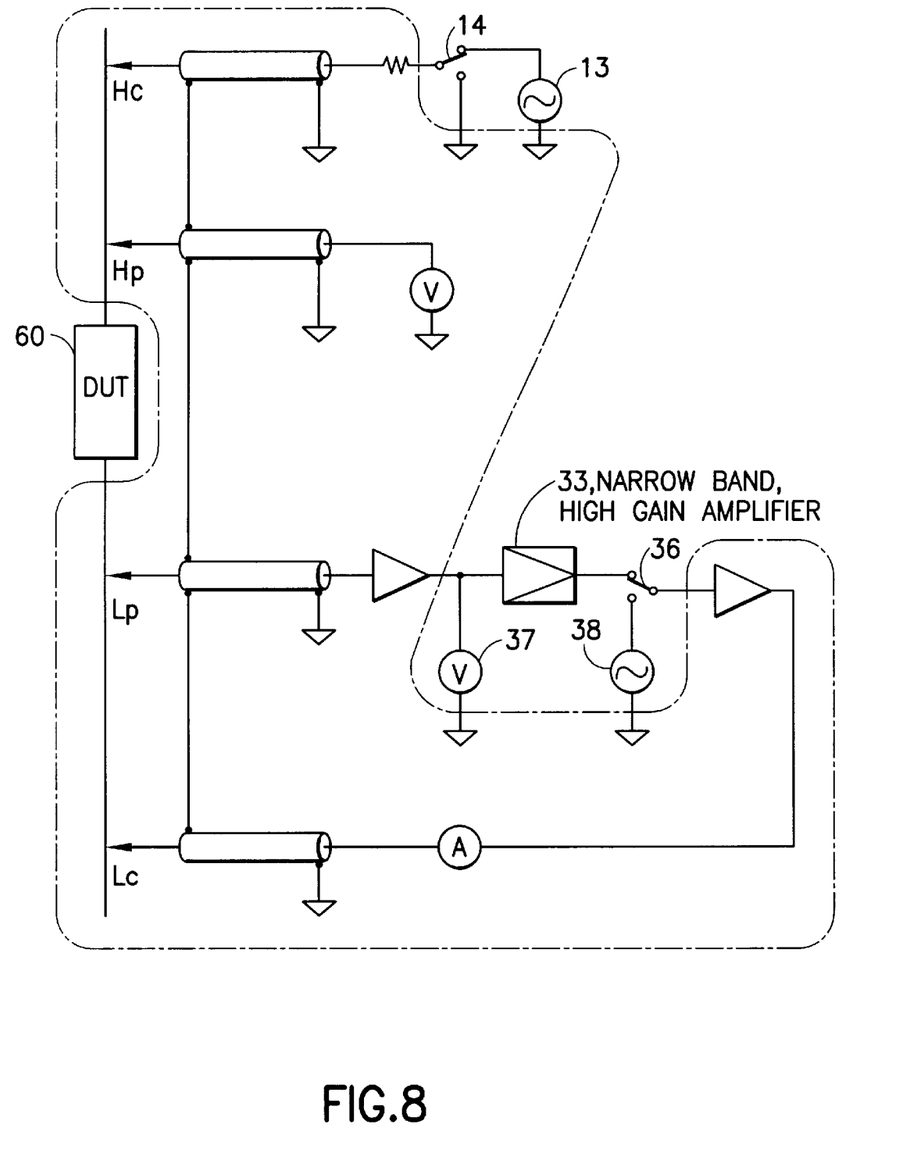
FIG. 8 shows the region for an equivalent circuit for one null loop circuit.
Figure 9:
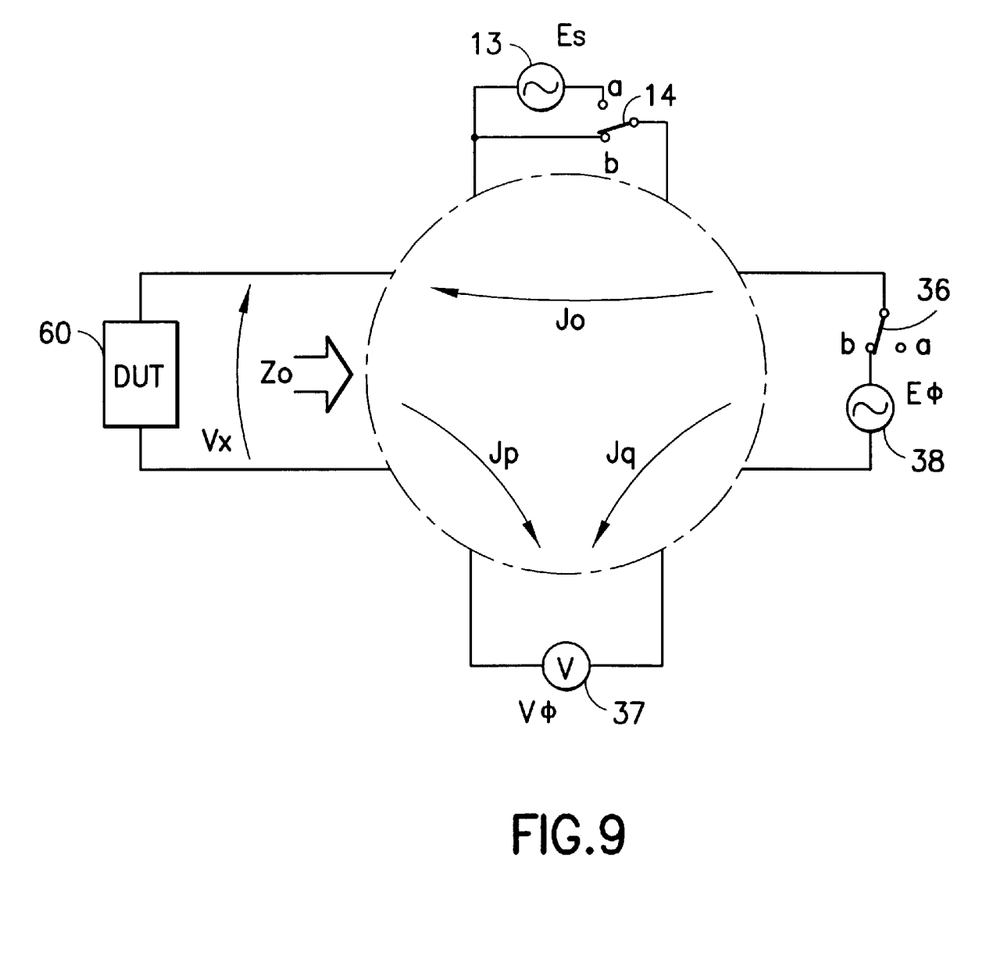
FIG. 9 shows an example of an equivalent circuit for one null loop circuit.

FIG. 6 will be used hereafter as a reference to provide some insight into measuring the loop transmission characteristics of the null loop including the DUT, but not including the narrow band high gain amplifier 33. The impedance measuring equipment in FIG. 6 is indicated by the area enclosed by the dotted lines, as illustrated in FIG. 8. The referenced dotted portion in FIG. 8 can be reduced to the portion referenced by a dotted circle, as shown in FIG. 9. It can be assumed that the circuit is linear.

Using the principle of superposition, $V\phi$ is the arithmetic sum of the voltage Vx across the DUT and $E\phi$, respectively multiplied by Jp and Jq (FIG. 9). In other words, $$V\phi = Jp \cdot Vx + Jq \cdot E\phi \tag{1}$$

where:
   $V\phi$ is the output voltage of the input amplifier.
   Vx is the voltage across the DUT.
   $E\phi$ is a signal introduced into the null loop from the input signal generator.
   Jp, Jq are constants.
At the same time, the voltage Eo across an open measurement terminal can be expressed by multiplying $E\phi$ by Jo:

$$Eo = Jo \cdot E\phi \tag{2}$$

where:
   Eo is the voltage across an open measurement terminal (i.e., when the DUT is not connected).
   $E\phi$ is a signal introduced into the null loop from the input signal generator.
   Jo is a constant.
If Zo is the impedance when the circuit network is viewed from the measurement terminal, the voltage Vx with the DUT connected is given by Thevenin's Theorem as follows:

$$Vx = Zx \cdot Eo/(Zx + Zo) \tag{3}$$

where:
   Zx is the impedance of the DUT.
   Zo is the impedance when the circuit network is viewed from the measurement terminal.
By substituting equation (2) into (3), and then equation (3) into (1), the following equation is derived:

$$V\phi = Jp \cdot Zx \cdot Jo \cdot E\phi/(Zx+Zo) + Jq \cdot E\phi$$

Therefore, if Kp is substituted for Jp·Jo, and Kq is substituted for Jq, the null loop transfer function becomes:

$$G = V\phi/E\phi = Kp \cdot Zx/(Zx+Zo) + Kq \tag{4}$$

where:
   G is the null loop transfer function.
   Kp, Kq and Zo are constants.
In equation (4), the three constants Kp, Kq, and Zo characterize the transfer function G.

Having derived the null loop transfer function G in equation (4), the relationship between the transfer function G and Zx will be described (i.e., how the null loop transfer function varies based on Zx).

Figure 10:
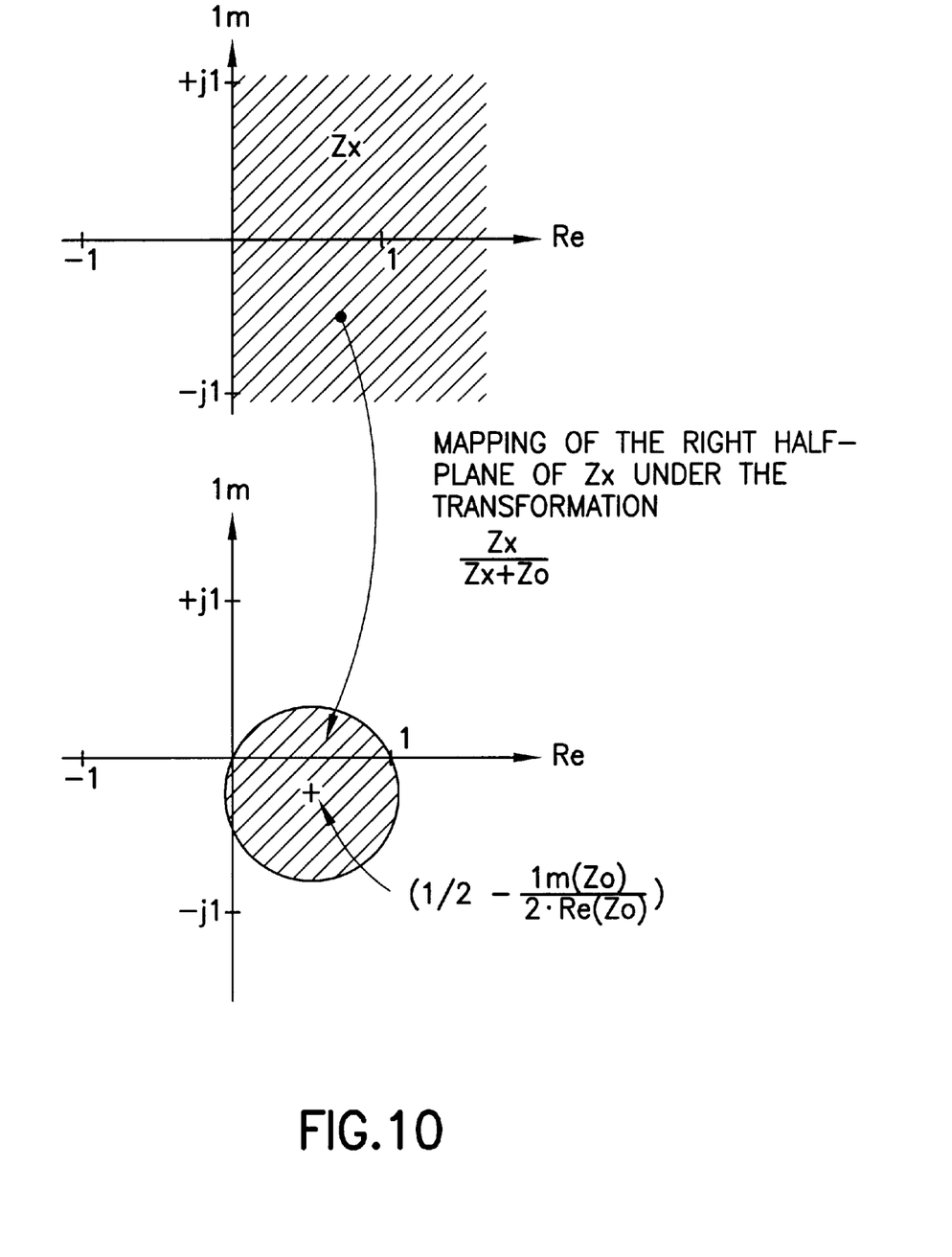
FIG. 10 shows an example of the mapping $Zx/(Zx+Zo)$

The characteristics of equation (4) are dominated by the expression Zx/(Zx+Zo). FIG. 10 shows the mapping from Zx to Zx/(Zx+Zo) in the complex plane. If conditions are chosen appropriately so that the real part of the impedance Zo viewed from the DUT is positive, the right half-plane of Zx (i.e., as indicated by the shaded area in FIG. 10) is mapped by the function Zx/(Zx+Zo) to the area inside a circle. The imaginary axis of Zx maps to the boundary of this circle (FIG. 10). Note that the main focus is on the right half-plane of Zx because measurements of DUTs with negative resistors are very rare.

Figure 11:
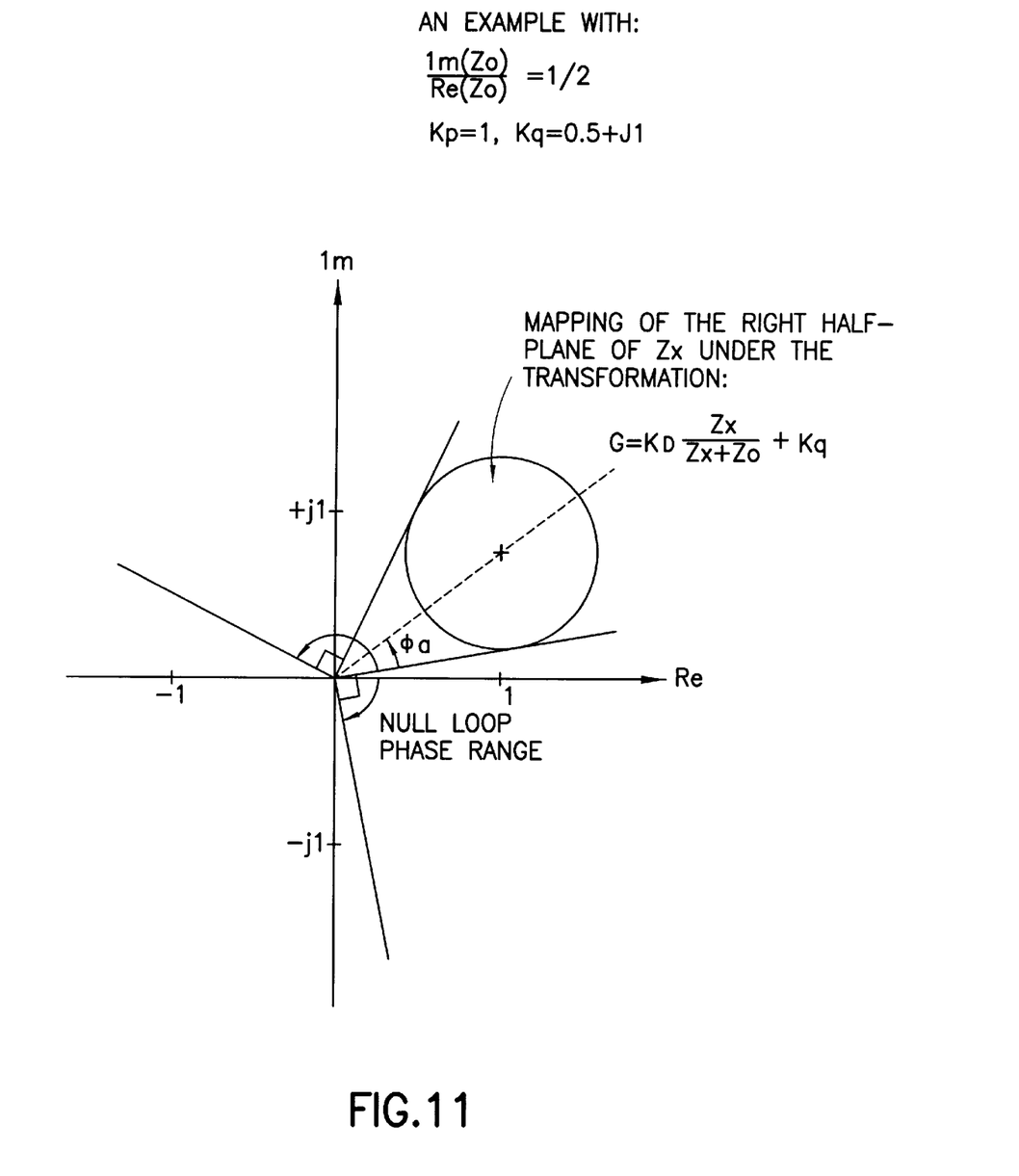
FIG. 11 shows an example of the mapping $Kp \cdot Zx/(Zx+Zo)+Kq$.

With Kp and Kq included in equation (4), that is, for the null loop transfer function excluding the narrow band high gain amplifier, the right half-plane of Zx maps to the circle, as shown in FIG. 11.

The phase characteristics of the narrow band high gain amplifier vary ±90 degrees within the narrow band. Therefore, the phase after one cycle of the null loop, including the narrow band high gain amplifier, covers a larger area by 90 degrees on either side of the circle (as shown FIG. 11). Since the region includes the positive x-axis of the complex plane, there is the possibility of oscillation.

Figure 12:
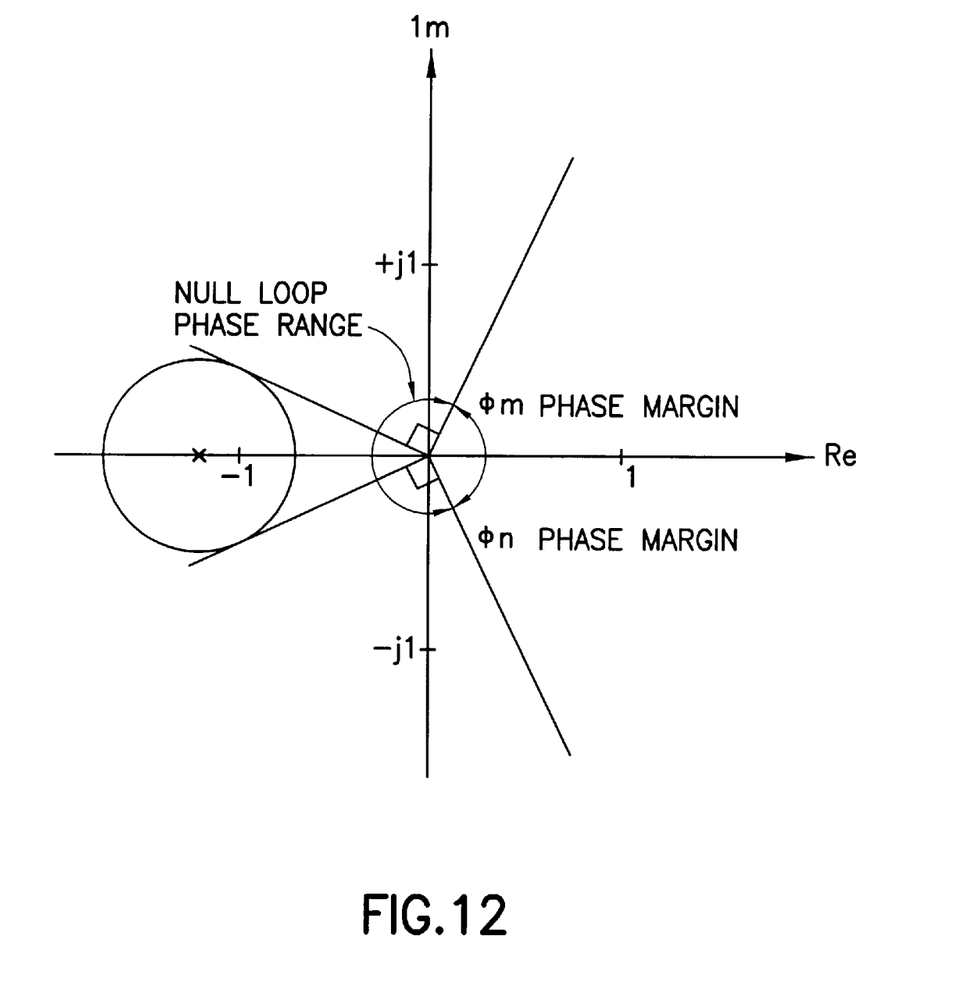
FIG. 12 shows an example of the mapping after phase shift.

However, if the phase of the orthogonal modulators is leaded by $(180-\phi a)$ degrees relative to the orthogonal phase detectors, the phase of the null loop will be in the region shown in FIG. 12 (where "$\phi a$" is the angle of the center of the circle). The phase margins of at least $\phi m$ and $\phi n$ will thus be guaranteed for the entire range of impedances of the DUTs, for the right half-plane of Zx.

The preferred embodiment of the invention for stabilizing the null loop involves the determination of $\phi a$ (based on FIGS. 10 and 11) and then the addition of a phase shift amount of $(180-\phi a)$ degrees.

Turning to equation (4), an explanation of how to determine the constants Kp, Kq, and Zo in equation (4) will be provided herein. The constants of equation (4) are redefined as follows:

$$A = Kp + Kq, \tag{5}$$

$$B = Kq \cdot Zo,$$

$$C = Zo$$

and the new constants A, B, C are substituted in equation (4) to form the following equation:

$$Zx \cdot A + B - G \cdot C = G \cdot Zx \tag{6}$$

A, B, and C can then be determined by measuring the transmission characteristics of the null loop using three known impedances as the DUTs. If the known impedances are represented as Z1, Z2, and Z3, and the measured values of the null loop transmission characteristics are represented as G1, G2, and G3, the following simultaneous equations are derived (in matrix form):

$$\begin{bmatrix} Z1 & 1 & -G1 \\ Z2 & 1 & -G2 \\ Z3 & 1 & -G3 \end{bmatrix} \begin{bmatrix} A \\ B \\ C \end{bmatrix} = \begin{bmatrix} G1 \cdot Z1 \\ G2 \cdot Z2 \\ G3 \cdot Z3 \end{bmatrix} \tag{7}$$

Based on equation (7), an equation can be derived to compute A, B, and C:

$$\begin{bmatrix} A \\ B \\ C \end{bmatrix} = \begin{bmatrix} Z1 & 1 & -G1 \\ Z2 & 1 & -G2 \\ Z3 & 1 & -G3 \end{bmatrix}^{-1} \begin{bmatrix} G1 \cdot Z1 \\ G2 \cdot Z2 \\ G3 \cdot Z3 \end{bmatrix} \tag{8}$$

Kp, Kq, and Zo can be determined from equations (8) and (5), which then allows $\phi a$ (i.e., the angle of the center of the circle) to be known.

As a practical matter, when a system is constructed with extended cables, the system is calibrated using three standard impedances commonly referred to as OPEN, SHORT, and LOAD. These three standard impedances can also be utilized as the three impedances (Z1, Z2, Z3) for determining the transmission characteristics in the present invention. In addition, the present invention can be employed, either before or after performing the impedance calculation, to determine the unknown numbers for the null loop transmission characteristics (G1, G2, G3) of the present invention.

Figure 1:
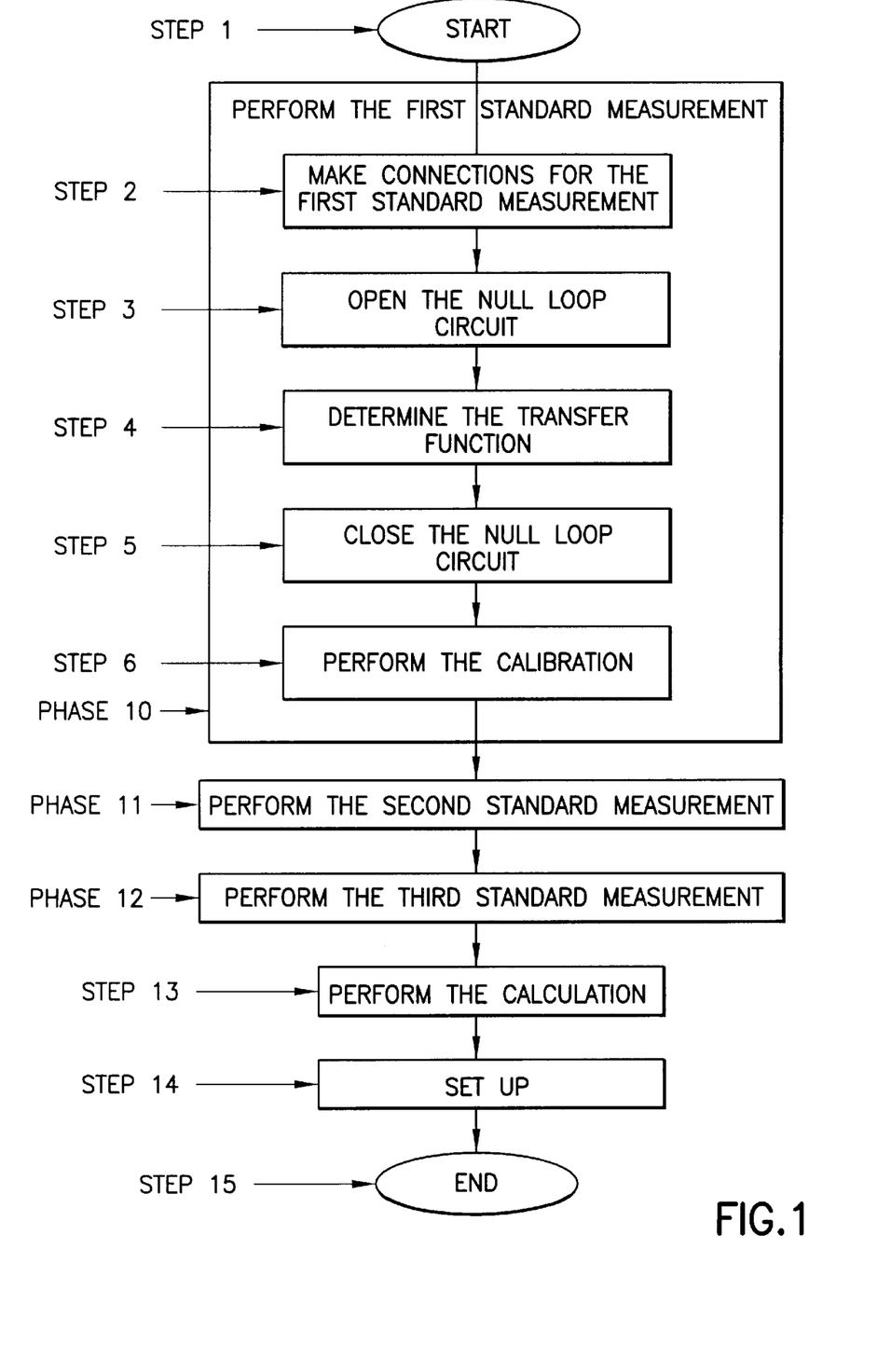
FIG. 1 shows a first embodiment of the present invention.

Referring to FIG. 1, the operation of extending cables during a system construction will now be described, in accordance with the present invention. At the outset, a first standard measurement is performed (Phase 10) which includes the following steps. The terminals are initially connected for the first standard measurement (Step 2). Switch 36 of FIG. 6 is switched to the input power supply side to open the null loop, and switch 14 is switched to the ground side (Step 3). The transmission characteristics of the null loop is then determined in order to obtain the first transmission characteristic value G1 (Step 4).

Thereafter, switches 36 and 14 are returned to their original positions, and the variable phase shifter of the narrow band high gain amplifier is set up such that the total phase shift amount of the null loop is 180 degrees, based on the phase shift value of the above-mentioned G1 (Step 5). Such an arrangement guarantees the stability of the null loop. The impedance determination is then performed in order to calibrate the impedance (Step 6).

Next, a second standard measurement is performed (Phase 11) which utilizes the same steps as described above for the first standard measurement (Phase 10). The second standard measurement (Phase 11) likewise involves making the connections for the second standard measurement; performing the same steps 3 through 6 as in phase 10 in order to obtain the second transmission characteristic value G2; setting up the variable phase shifter of the narrow band high gain amplifier so that the total phase shift amount of the null loop is 180 degrees, based on the phase shift value of G2; and then performing the second standard measurement in order to calibrate the impedance.

Thereafter, a third standard measurement is performed using the same method as those described for the first and-second standard measurements. The third transmission characteristic value G3 is obtained and the third standard impedance measurement is performed in order to calibrate the impedance.

The three measured values for the transfer function (G1, G2, G3) are then placed into equation (8) to determine A, B and C. Equation (5) is then utilized to determine Kp, Kq, and Zo of equation (4) (Step 13). By allowing Zx in equation (4) to apply over all impedances for the DUTs, φa can be obtained and the best phase shift amount can be determined. The phase shift amount is then set up (Step 14).

According to the above procedure, the null loop phase compensation serves the purpose of stabilizing the negative feedback circuit, and as long as the null loop operates stable it has no effect on the measured value of the impedance for calibration. Therefore, even if the phase shift amount as determined by the above procedure is specified for the variable phase shifter, there is no effect on the calibration results.

It should be understood that, in some cases, there is no solution for the phase compensation amount that guarantees stability of the null loop for DUTs over all expected values. In such a case, as necessary, it is possible to provide a warning when performing the phase compensation function and to suggest improving the extended cables.

Note that while phase compensation has only been discussed so far, the present invention may be applied in a broader sense. For instance, the present invention can also be applied to supply a gain compensation. Such an arrangement can be implemented by providing a gain adjustment section, either within the narrow band high gain amplifier or elsewhere within the null loop circuit.

In summary, the present invention provides a method to remedy the phase compensation problem associated with the feedback amplifier (null loop) and, thus, to allow impedance measurement equipment using four-terminal pairs to perform remote measurements in the high frequency range. The present invention utilizes three known impedances that are connected to the measurement terminals, measures the transmission characteristics of the null loop for each known impedance and then predicts the null loop characteristics with respect to arbitrary impedances of DUTs.

The invention having thus described with particular reference to the preferred forms thereof, it will be obvious that various changes and modifications may be made therein without departing from the spirit and scope of the invention as defined in the appended claims.

I claim:

1. A method for stabilizing a feedback loop in impedance measuring equipment, said impedance measuring equipment having means for applying a measurement voltage to a first measurement terminal of a device under test (DUT), a feedback loop for receiving a current that flows out a second terminal of said DUT, means for measuring transmission characteristics of said feedback loop, and a variable phase shifter for adjusting a phase shift within said feedback loop, wherein a current flowing through said DUT is measured while holding said second measurement terminal at an electrical potential close to ground, comprising the steps of:

a) measuring transmission characteristics of said feedback loop for at least three impedance standards connected across said first and second measurement terminals, said impedance standards having impedance values spanning a range of DUT impedances;

b) calculating a phase shift amount based on measurement results for said three impedance standards obtained in step a); and c) applying said phase shift amount to said variable phase shifter so as to modify the phase shift amount in said feedback loop, said phase shift amount applied to said feedback loop so as to maintain stability of said feedback loop over an entire said range of DUT impedances.

2. A method as recited in claim 1, wherein said three impedance standards are OPEN, SHORT and LOAD, said LOAD impedance standard comprising an impedance between OPEN and SHORT.

3. A method as recited in claim 1, wherein said phase shift amount causes a minimum phase margin on a trailing side of said feedback loop to equal a minimum phase margin on a leading side of said feedback loop, as a measured impedance is varied over an entire impedance range of said DUTs.

* * * * *